United States Patent
Carter et al.

[11] Patent Number: 5,953,627
[45] Date of Patent: Sep. 14, 1999

[54] PROCESS FOR MANUFACTURE OF INTEGRATED CIRCUIT DEVICE

[75] Inventors: Kenneth Raymond Carter, San Jose, Calif.; Robert Francis Cook, Putnam Valley, N.Y.; Martha Alyne Harbison, Sacramento, Calif.; Craig Jon Hawker, Los Gatos, Calif.; James Lupton Hedrick, Pleasanton, Calif.; Sung-Mog Kim, Taejon, Rep. of Korea; Eric Gerhard Liniger, Danbury, Conn.; Robert Dennis Miller; Willi Volksen, both of San Jose, Calif.; Do Yeung Yoon, Los Gatos, Calif.

[73] Assignee: International Business Machines Corporation, Armonk, N.Y.

[21] Appl. No.: 08/965,541

[22] Filed: Nov. 6, 1997

[51] Int. Cl.$^6$ .................................................. H01L 21/28
[52] U.S. Cl. ........................ 438/623; 438/780; 438/781
[58] Field of Search .................................. 438/623, 780, 438/781, 782

[56] References Cited

U.S. PATENT DOCUMENTS 4,626,556  12/1986  Nozue et al. .............................. 522/99
5,767,014  6/1998  Hawker et al. .......................... 438/623

OTHER PUBLICATIONS

D. Loy et al., "Bridged Polysilsesquioxanes. High Porous Organic–Inorganic Materials", Chem. Rev. 19955, 95, 1431–1442.

R. Baney et al., "Silsesquioxanes", Chem. Rev. 1995, 1409–1430.

*Primary Examiner*—Caridad Everhart
*Attorney, Agent, or Firm*—Robert B. Martin

[57] ABSTRACT

The invention relates to a process for making an integrated circuit device comprising (I) a substrate, (ii) metallic circuit lines positioned on the substrate, and (iii) a dielectric material positioned on the circuit lines. The dielectric material comprises the condensation product of silsesquioxane precursor in the presence of an organic amine having a boiling point greater than 150° C.

8 Claims, 2 Drawing Sheets

PROCESS FOR MANUFACTURE OF INTEGRATED CIRCUIT DEVICE

FIELD OF THE INVENTION

The present invention relates to an improved process for the manufacture of dielectric layers in integrated circuit devices.

BACKGROUND OF THE INVENTION

There is a continuing desire in the microelectronics industry to increase the circuit density in multilevel integrated circuit devices, e.g., memory and logic chips, thereby increasing their performance and reducing their cost. In order to accomplish this goal, there is a desire to reduce the minimum feature size on the chip, e.g., circuit linewidth, and also to improve the properties of the interposed layer of dielectric material to lower the dielectric constant and avoid cracking of the dielectric layers during manufacturing of the integrated circuit device.

One prior art dielectric material used in integrated circuit devices is a slurried particulate glass which is coated as a film on a substrate and sintered to form the dielectric layer. Unfortunately, sintering requires very high temperatures which are unsuitable in some applications. A solution of methyl silsesquioxane is sold by Allied Signal Corp. under the trademark AS-418 for use as a dielectric material in microelectronics. A solution of hydridosilsesquioxane is also sold by Dow Corning Corp. under the Trademark $FO_x$ for use in microelectronics. However, films of silsesquioxane, especially thicker films which are required for dielectric layers in microelectronics, have a tendency to crack during manufacturing. There is a continuing need in the art for a low dielectric composition which can be readily formed into thick films and processed without cracking.

It is therefore an object of the present invention to provide an improved dielectric composition and process for forming the dielectric layers in integrated circuit devices.

Other objects and advantages will be apparent from the following disclosure.

SUMMARY OF THE INVENTION

The present invention relates to a process for making an integrated circuit device. The dielectric composition for use in the process of the present invention comprises silsesquioxane precursor and an organic amine having a boiling point greater than 150° C. The integrated circuit device comprises (i) a substrate, (ii) interconnecting metallic circuit lines positioned on the substrate, and (iii) a dielectric material positioned contiguous to the circuit lines (over and/or between the circuit lines). The dielectric material in the integrated circuit device is condensed silsesquioxane network.

The process for forming the integrated circuit device involves thermal condensation of a film of a nonaqueous dielectric composition i.e., a low molecular weight silsesquioxane precursor and an organic amine base having a boiling point greater than 150° C. The silsesquioxane precursor and amine are dissolved in an organic solvent. The high boiling point amine surprisingly enables extensive condensation of the silsesquioxane network at a lower temperature resulting in a film of dielectric composition with improved properties.

A more thorough disclosure of the present invention is presented in the detailed description which follows and from the accompanying drawing.

DETAILED DESCRIPTION OF THE INVENTION

Figure 1:
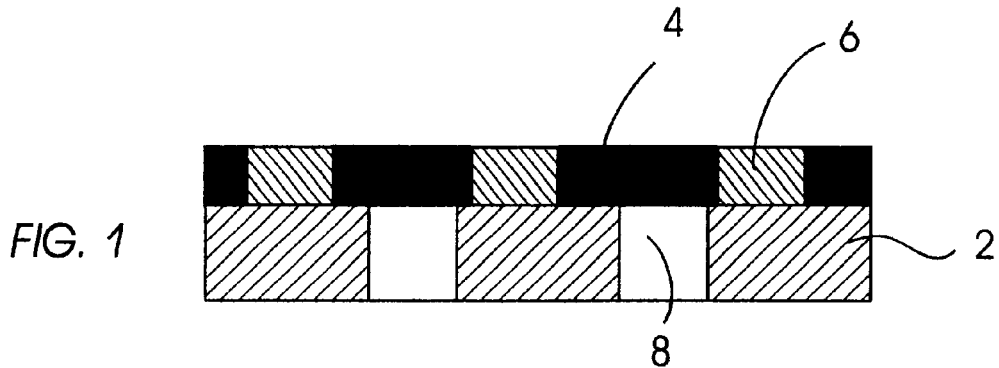
FIG. 1 is a cross-sectional view of a portion of the integrated circuit device of the present invention.

An embodiment of the integrated circuit device made by the process of the present invention is shown in FIG. 1. The device generally comprises substrate 2, metallic circuit lines 4, and dielectric material 6. The substrate 2 has vertical metallic studs 8 formed therein. The circuit lines function to distribute electrical signals in the device and to provide power input to and signal output from the device. Suitable integrated circuit devices will generally comprise multiple layers of circuit lines which are interconnected by vertical metallic studs.

Suitable substrates for the device comprise silicon, silicon-germanium, silicon nitride, and gallium arsenide. Other suitable substrates will be known to those skilled in the art. In a multilayer integrated circuit device, an underlying layer of insulated, planarized circuit lines can also function as a substrate.

Suitable circuit lines generally comprise a metallic, electrically conductive material such as copper, aluminum, tungsten, gold, silver, or alloys thereof. Optionally, the circuit lines may be coated with a metallic liner such as a layer of nickel, tantalum, or chromium, and/or other layers such as barrier or adhesion layers (e.g., SiN, TiN).

The process of the present invention involves forming the dielectric layer which is positioned over the circuit lines and/or between the circuit lines, and on the substrate. In multilevel integrated circuit devices, the dielectric layer is often planarized to function as a substrate layer for lithographic formation of the next layer of circuit lines.

Suitable silsesquioxanes for use as a dielectric in the present invention are known to those skilled in the art. Suitable silsesquioxane for the present invention are unsubstituted or substituted with alkyl (e.g., $C_{1-4}$-alkyl), phenyl or alkyl/phenyl. Preferred silsesquioxane is alkyl(methyl) phenyl silsesquioxane examples of which are commercially available (e.g., GR650 and 950 from Techniglass, Perrysburg, Ohio). Other suitable silsesquioxanes will be known to those skilled in the art such as disclosed in U.S. Pat. No. 5,384,376 and Chem. Rev. 95, 1409–1430 (1995), the disclosures of which are incorporated herein by reference. The silsesquioxane used in the process of the present invention is partially condensed silsesquioxane preferably having a molecular weight $M_N$ of less than 1500, preferably less than 1000. The silsesquioxane precursor can be optionally mixed with tetraalkoxysilane e.g., tetraethoxysilane, alkyl/trialkoxy or trihalo silicates or dialkyl/dialkoxy or dihalo silicates.

Suitable organic amine bases for use in the process of the present invention include primary, secondary and tertiary, aliphatic and aromatic organic amines having a boiling point greater than 150° C., preferably greater than 175° C., more preferably greater than 200° C. Suitable amines include hydroxy substituted amines such as hydroxyalkyl amines e.g., diethanolamine and N-methyldiethanolamine and N-hydroxyamines such as N-hydroxy alkyl phenyl amine e.g., N-ethyl-N-hydroxyaniline; N,N'-dihydroxyaniline and other amines such as bis(4-aminocyclohexyl) methane; bis (γ-aminopropyl)disiloxane; and N-methyl (3,3'-dioxa-5, 5'dihydroxy) dipentylamine. Other suitable amines are amines functionalized with other hydrogen bonding substituents such as esters, nitriles, amides or urethanes. Other suitable amines are disclosed in Angelopoulos et al., U.S. Pat. No. 5,310,625, the disclosure of which is incorporated herein by reference. Other suitable amines will be known to those skilled in the art. Preferred amines are hydroxy substituted amines. The amine can also be oligomeric, e.g., polyethylene imine or amino substituted polyethers. The amine is suitably soluble in the solution of starting silsesquioxane in organic solvent.

Figure 2:
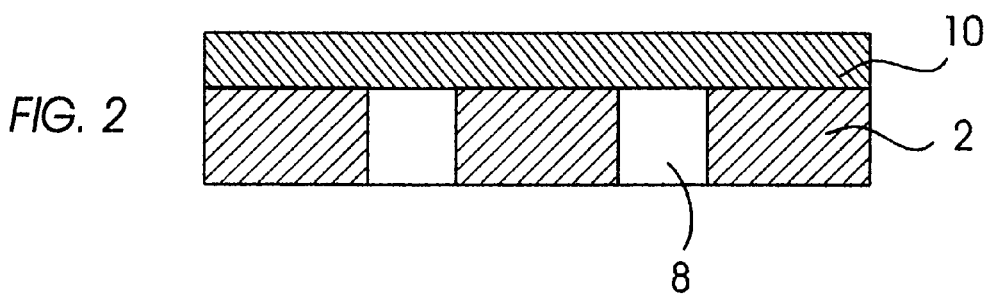
FIGS. 2–5 show a process for making the integrated circuit device of the present invention.

Referring to FIG. 2, the first step of one process embodiment of the present invention involves disposing on a substrate 2 a layer or film 10 of the dielectric composition of the present invention comprising silsesquioxane precursor and organic amine. The substrate 2 is shown with vertical metallic studs 8. The nonaqueous dielectric composition is dissolved in a suitable organic solvent for both the amine and silsesquioxane precursor to form a solution. Suitable organic solvents include N,N'dimethylpropyleneurea (DMPU), NMP, propylene glycol monomethyl ether acetate, ethyl lactate, ethyl β-methoxypropionate, γ-butyrolactone or the like. The amine concentration will suitably be about 0.1–1.2 mmoles/gram of silsesquioxane. The nonaqueous solution is applied as a film to the substrate by art-known methods such as spin, dip or spray coating or doctor blading. The film will have a thickness of greater than 0.5 microns, preferably greater than 1.0 micron, more preferably greater than 1.5 microns. The solution has a low viscosity at high solids level e.g., greater than 20 weight % preferably greater than 30 weight % so that it will planarize the substrate, gap fill and result in thicker cured films. The second step of the process involves heating the film in rampwise fashion to an elevated temperature to cross-condense the silyl reactive groups of the silsesquioxane. The organic amine base catalyzes the extension and cross-condensation reaction enabling a higher degree of cure at a lower temperature. The amine has a high boiling point greater than 150° C. so that it remains insitu during condensation of the silsesquioxane and is then removed by heating upon completion of the condensation reaction.

Figure 3:
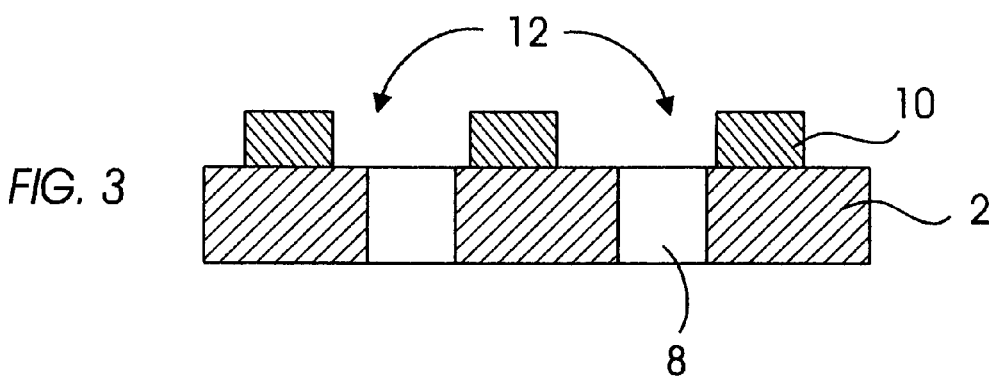

Referring to FIG. 3, the third step of the process involves lithographically patterning the layer 10 of dielectric composition to form trenches 12 (depressions) in the layer of composition. The trenches 12 shown in FIG. 3 extend to the substrate 2 and to the metallic stud 8. Lithographic patterning generally involves (i) coating the layer 10 of dielectric composition with a positive or negative photoresist such as those marketed by Shipley or Hoechst Celanese (AZ photoresist); (ii) imagewise exposing (through a mask) the photoresist to radiation such as electromagnetic, e.g., UV or deep UV including 193 nm; (iii) developing the image in the resist, e.g., with suitable basic developer; and (iv) transferring the image through the layer 10 of dielectric composition to the substrate 2 with a suitable transfer technique such as reactive ion beam etching (RIE). Suitable lithographic patterning techniques are well known to those skilled in the art such as disclosed in Thompson et al., "Introduction to Microlithography" (1994), the disclosure of which is incorporated herein by reference.

Figure 4:
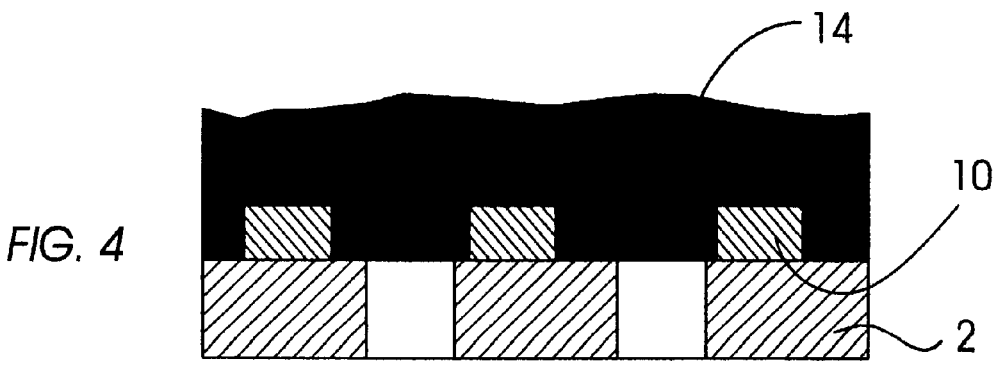

Referring to FIG. 4, in the fourth step of the process for forming the integrated circuit of the present invention, a metallic film 14 is deposited onto the patterned dielectric layer 10. Preferred metallic materials include copper, tungsten, and aluminum or alloys. The metal is suitably deposited onto the patterned dielectric layer by art-known techniques such as sputtering, laser vaporization, chemical vapor deposition (CVD), plasma-enhanced CVD, electro and electroless deposition, sputtering, or the like.

Figure 5:
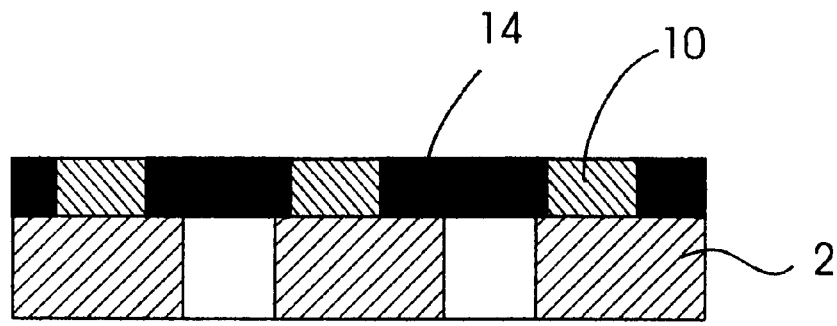

Referring to FIG. 5, the last step of the process involves removal of excess metallic material and planarizing the entire wafer surface so that film 14 is generally level with the patterned dielectric layer 10. This can be accomplished using chemical/mechanical polishing or selective wet or dry etching. Suitable chemical/mechanical polishing methods are known to those skilled in the art.

Figure 6:
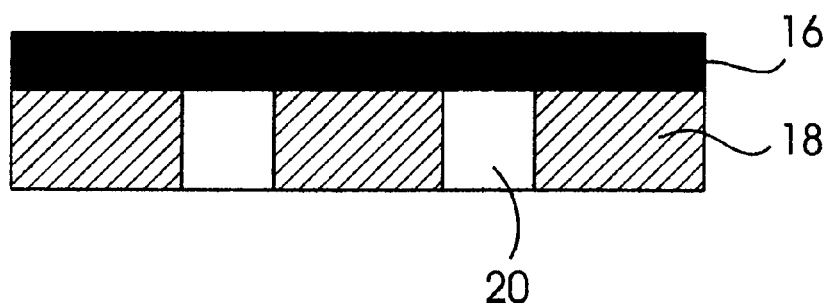
FIGS. 6–8 show an alternative process for making the integrated circuit device of the present invention.
Figure 7:
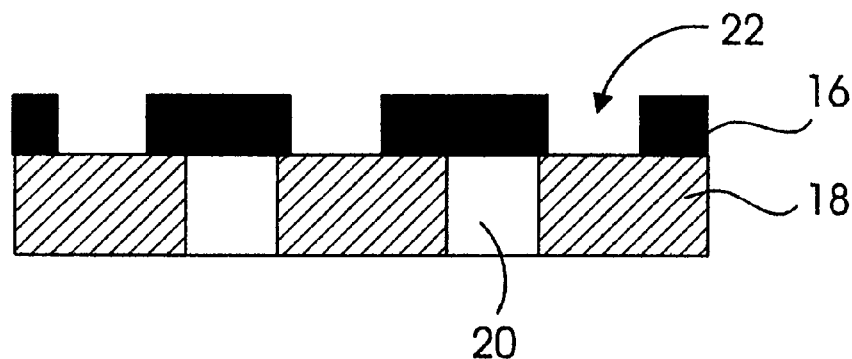
Figure 8:
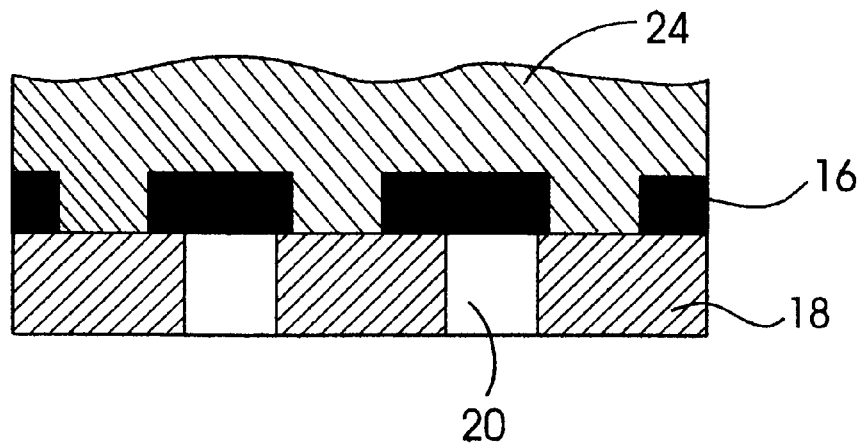

Referring to FIGS. 6–8, there is shown an alternative embodiment of the process of the present invention for making the integrated circuit devices. The first step of the process in this embodiment involves depositing a metallic film 16 onto a substrate 18. Substrate 18 is also provided with vertical metallic studs 20. Referring to FIG. 7, in the second step of the process, the metallic film is lithographically patterned through a mask to form trenches 22. Referring to FIG. 8, in the third step of the process, a layer 24 of dielectric composition of the present invention is deposited onto the patterned metallic film 16. In the last step of the process, the composition is heated to completely condense the silsesquioxane. Optionally, the dielectric layer itself may then be planarized for subsequent processing in a multilayer integrated circuit.

The dielectric composition of the present invention has a dielectric constant less than 3.0, preferably less than 2.7, more preferably less than 2.5 at 80° C. The composition has enhanced mechanical toughness and polishing characteristics, enhanced thermal stability and enhanced dielectric properties. Further, the dielectric composition has enhanced mechanical properties that resist cracking even for thick films (e.g., thickness of greater than 1.0 micron) and even in high ambient humidity. The composition can be chemically/mechanically planarized to facilitate lithographic formation of additional circuit levels in multilevel integrated circuit devices. The dielectric composition adheres well to the substrate. The dielectric composition undergoes minimal shrinkage during heating.

The following examples are detailed descriptions of the process of the present invention. The detailed preparations fall within the scope of, and serve to exemplify, the more generally described methods set forth above. The examples are presented for illustrative purposes only, and are not intended as a restriction on the scope of the invention.

EXAMPLE 1

Film Formation

A 30% w/w solution of solid methylsilsesquioxane with a number average molecular weight between 700–900 g/mole as determined by 1H NMR in propylene glycol monomethylether acetate was prepared and filtered (0.2 micron). To this solution was added 4% by weight based on the solution of N-methyldiethanol amine (1.1 mmole of base/gram of resin). The solution was filtered immediately (0.2 micron) and films (1.2 microns) were prepared by spinning. The film was ramped to 210° C. and held for 2 hours. The film was then ramped to 410° C. and held for 2 hours at this temperature.

EXAMPLE 2

Film Testing (a) Crack Formation

Cracks were generated in the film with a pyramidal diamond indentor tip. The film was immersed in water. The crack propagation proceeded with a velocity of $2\times10^{-6}$ m/s. Methylsilsesquioxane MSSQ films of same thickness formed in the same procedure without amine propagated at a velocity of $3\times10^{-5}$ m/s.

(b) Dielectric Constant 2.62 at room temperature

Film of Example 1 2.48

Film of MSSQ 2.75 at room temperature
2.69 at 100° C.

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

What is claimed is:

1. A process for forming an integrated circuit device comprising:

(a) positioning on a substrate a nonaqueous layer of silsesquioxane and an organic amine having a boiling point greater than 150° C.;

(b) heating the composition to react the silsesquioxane;

(c) lithographically patterning the dielectric layer;

(d) depositing a metallic film onto the patterned dielectric layer; and (e) planarizing the film to form the integrated circuit.

2. The process of claim 1 wherein the organic amine has a boiling point greater than 200° C.

3. The process of claim 2 wherein the organic amine is a hydroxyamine.

4. The process of claim 3 wherein the silsesquioxane is $C_{1-4}$ alkyl silsesquioxane or $C_{1-4}$ alkyl/phenyl silsesquioxane.

5. A process for forming an integrated circuit comprising:

(a) depositing a metallic film on a substrate;

(b) lithographically patterning the metallic film;

(c) depositing on the patterned metallic film a nonaqueous layer of a dielectric composition comprising silsesquioxane and an organic amine having a boiling point greater than 150° C.;

(d) heating the composition to react the silsesquioxane.

6. The process of claim 5 wherein the organic amine has a boiling point greater than 200° C.

7. The process of claim 6 wherein the organic amine is a hydroxyamine.

8. The process of claim 7 wherein the silsesquioxane is $C_{1-4}$ alkyl silsesquioxane or $C_{1-4}$ alkyl/phenyl silsesquioxane.

* * * * *